United States Patent [19]

Schlafer

[11] 4,023,126
[45] May 10, 1977

[54] SCANNING PHOTOGRAPHIC PRINTER FOR INTEGRATED CIRCUITS

[75] Inventor: John Schlafer, Wayland, Mass.

[73] Assignee: GTE Laboratories Incorporated, Waltham, Mass.

[22] Filed: June 26, 1975

[21] Appl. No.: 590,788

[52] U.S. Cl. .................................. 355/51; 355/66
[51] Int. Cl.$^2$ ...................................... G03B 27/70
[58] Field of Search .................. 355/51, 57, 60, 62, 355/63, 65, 66, 52

[56] References Cited

UNITED STATES PATENTS

| | | | |
|---|---|---|---|
| 2,830,491 | 4/1958 | Domeshek | 355/52 X |
| 3,598,489 | 8/1971 | Thomas et al. | 355/51 |
| 3,884,573 | 5/1975 | Franklin | 355/51 |

*Primary Examiner*—Richard A. Wintercorn
*Attorney, Agent, or Firm*—Irving M. Kriegsman; Bernard L. Sweeney; Robert A. Seldon

[57] ABSTRACT

One embodiment of the disclosed apparatus converges a beam of light to a point of focus and scans that point of focus through an arc at a predetermined radius. The beam of light is then imaged to another point of focus by a unitary power optical system. The second point of focus, therefore, also scans through an identical arc which is displaced by a selected distance along the optical axis from the first point of focus. A master mask for exposing a photoresist on a semiconductor wafer is located at the first point of focus and the semiconductor wafer whose layer of photoresist is to be exposed is located at the second point of focus. However, the mask and wafer are mounted in a different fixture which is radially translatable relative to the scanning beam of light so that a sequence of scans of the beam of light across the mask and wafer serves to illuminate all areas of the mask and to thereby image the information on the mask onto the photoresist layer on the semiconductor wafer. In this manner, the information contained in the mask is rapidly and economically transferred from the mask to the wafer.

11 Claims, 2 Drawing Figures

SCANNING PHOTOGRAPHIC PRINTER FOR INTEGRATED CIRCUITS

BACKGROUND OF THE INVENTION

The present invention is related generally to a new and improved apparatus for photographic printing and is more particularly concerned with a novel apparatus for photographically exposing a photoresist layer on a semiconductor wafer by a scanning technique.

Modern technology is relying to an increasing extent on the use of integrated circuit components for performing a multitude of functions previously performed, if at all, by discrete circuit components. Therefore, the demand is increasing for new and improved techniques and apparatus for producing such integrated circuit components with greater reliability and at a lesser cost.

Conventionally, integrated circuit components have been produced by exposing a photoresist layer which has been deposited on a semiconductor wafer such that it records faithfully the image of a master mask on that semiconductor wafer. The image recorded in the photoresist layer is then utilized to form the various component elements of the integrated circuits by techniques which are well known in the art and which do not form a part of the present invention.

One such technique which has been widely utilized for exposing the photoresist layer is contact printing. In contact printing, the master mask is pressed into physical contact with the photoresist layer and an exposure of the photoresist is then made. A major difficulty has occurred with the utilization of this technique in that, after a number of printing operations have been made with a mask, imperfections in the semiconductor surface and photoresist layer tend to damage the mask thereby making its useful life only a few cycles. A new mask must then be substituted which leads to significantly increased costs and time during the manufacturing process.

One method which has been derived which overcomes the problems of wear damage to the mask is to projection print the information contained in the master mask into the photoresist layer with an optical system. To be a viable process, resolution exceeding one micrometer line width in the projected image must be attained. To accomplish such resolution, the optical system must be large, expensive and be constructed to extremely critical tolerances. Furthermore, the larger the area which must be transferred from the mask to the semiconductor wafer, the more difficult and complex the lens design becomes. In addition, problems exist in projection printing techniques with regard to focussing the image on the semiconductor material and in maintaining registration with previously imposed images. Necessarily, all of these problems lead to significant increases in cost and complexity of the apparatus utilized for forming the integrated circuit.

SUMMARY OF THE INVENTION

Accordingly, it is an object of the present invention to provide a new and novel apparatus for photographically exposing the photoresist layer on a semiconductor wafer by a technique which does not involve contact printing and which does not require complex optical systems in order to accomplish the printing process.

Another object of the invention is to provide such an apparatus in which only a small portion of the information contained in the mask is transferred to the wafer at a time.

A further object of the invention is to provide such an apparatus in which means are provided for maintaining alignment between the mask and semiconductor wafer during successive exposures in the apparatus.

It is a still further object of the invention to provide such an apparatus which is readily adaptable to use with a plurality of stations.

Briefly, the invention in its broadest aspects comprises a scanning photographic printer for integrated circuits. The printer includes a source of a beam of light which is generally transmitted and centered along an optical axis. A first fixture is included which is rotatable about an axis of rotation and which includes a first mirror which is adjacent and inclined to the axis of rotation of the first fixture and affixed thereto. The first mirror is also inclined to the optical axis so that at least a portion of the beam of light is reflected away from the axis of rotation and is scanned through a sector as the mirror rotates. An optical means is disposed in the reflected beam of light and is affixed to the first fixture for bringing the reflected beam of light to a first point of focus along a reflected beam optical axis defined by the optical means. A second mirror, which is also affixed to the first fixture, reflects the beam of light so that the reflected beam optical axis thereafter is generally parallel to the axis of rotation. The second mirror reflects the beam of light prior to the first point of focus. A unitary power, nonreversing optical system is aligned along the reflected beam optical axis beyond the first point of focus and brings the reflected beam of light to a second point of focus. A second fixture is provided which is radially translatable relative to the rotating first fixture and includes a means for positioning a partially transparent mask generally orthogonal to the reflected beam optical axis in the vicinity of the first point of focus. Means are also provided in the second fixture for positioning an integrated circuit substrate to be photographically printed generally orthogonal to the reflected beam optical axis in the vicinity of the second point of focus. Finally, means are provided for translating the second fixture relative to the first fixture at a predetermined rate. The predetermined rate is directly proportional to the rotational speed of the first fixture whereby the reflected beam is scanned sequentially across the surface of the mask and an image thereof is sequentially imposed on the integrated circuit substrate thereby photographically exposing the integrated circuit substrate.

Further objects, advantages and features of the invention will be apparent in the arrangement and construction of the constituent parts in detail as set forth in the following specification taken together with the accompanying drawing.

DETAILED DESCRIPTION OF THE PREFERRED EMBODIMENT

Figure 1:
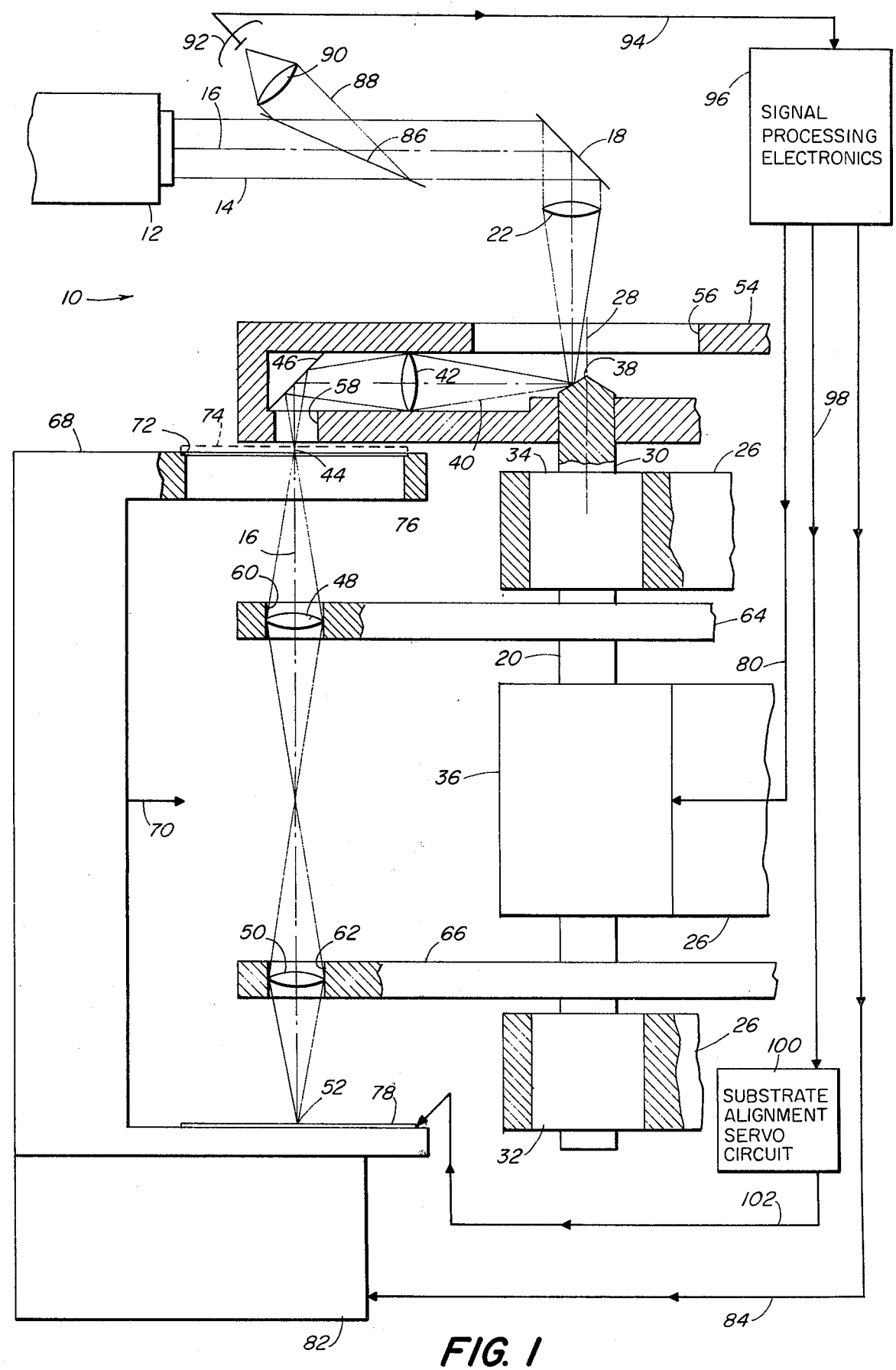
FIG. 1 is a partially broken away, partially schematic side elevation view of a preferred embodiment of an apparatus according to the present invention.

In referring to the various figures of the drawing hereinbelow, like reference numerals will be utilized to refer to identical parts of the apparatus.

Referring initially to FIG. 1 of the drawing, there is shown a scanning photographic printer for integrated circuits according to the present invention which is indicated generally by the reference numeral 10. The printer 10 includes a source 12 of a beam of light 14 which is generally transmitted and centered along an optical axis 16. Preferably, the light source 12 is a monochromatic source of light, such as a laser; however, other sources may also be utilized although compensation for chromatic aberrations may be necessary. The beam of light 14 is reflected by a stationary mirror 18 toward a first fixture 20. A means such as a lens 22 converges the beam of light 14 to a first focal point 24 which is disposed along the optical axis 16.

The first fixture 20 is journaled in a support 26. The first fixture 20 rotates about an axis of rotation 28 which also forms the axis of a central cylindrical shaft 30. The remaining parts of the rotating fixture 20 are coupled to the shaft 30. The shaft 30 is journaled in a pair of bearings 32 and 34 which are attached to the support 26. A motor 36 which is also attached to the support 26 serves to drive the fixture 20 at a predetermined rotational speed which is selected so as to accommodate exposure requirements for the photoresist material utilized.

A first mirror 38 is affixed to a first end of the cylindrical shaft 30. In the preferred embodiment, the mirror 38 is formed as one of a plurality of triangular planar facets ground onto the first end of the cylindrical shaft 30. If the optical axis 16 prior to impingement on the mirror 18 is essentially parallel to but displaced slightly from the axis of rotation 28, the optical axis will be deflected generally normal to the rotational axis 28 by a facet 38 inclined nominally to the rotational and optical axes at a 45° angle.

The mirror surface 38 intersects the optical axis 16 near to but not at the first point of focus 24. This arrangement is advantageous because switching of the beam occurs very rapidly at the edges of the facet when the beam diameter on the surface of the mirror 38 is very small. However, minor imperfections in the mirror surface 38 do not scatter the light appreciably as would occur if the surface 38 were located precisely at the point of focus 24.

The reflected beam of light 40 is collected by an optical element 42, again shown as a positive lens, and focussed to a second point of focus 44. Prior to reaching the second point of focus 44, the reflected beam of light 40 is again reflected by a mirror 46 so that the reflected portion of the optical axis 16 is essentially parallel to the axis of rotation 28.

Beyond the second point of focus 44, a unitary power, nonreversing optical system, which is shown as being comprised of a pair of positive lenses 48 and 50 and which is also aligned along the reflected portion of the optical axis 16, brings the reflected beam of light to a third point of focus 52.

In addition to the foregoing optical elements, the first fixture 20 is comprised of a series of mechanical elements which serve to mount and move the various optical elements described above. Generally speaking, the optical elements are housed in three disc shaped sections which are affixed to the rotating shaft 30. The uppermost of these sections 54 is a hollow disc having a large, generally centered hole 56 in the upper surface through which the converging beam of light from the lens 22 can pass. The lens 42 and the mirror 46 are mounted internally in the hollow section 54 and direct the reflected beam of light out through a small aperture 58 in the bottom surface thereof. The lenses 48 and 50 of the unitary power, non-reversing optical system are mounted within apertures 60 and 62 in lens supporting discs 64 and 66 respectively.

Therefore, as the beam of light is incident on the first mirrored surface 38, that surface is rotating with the shaft 30 and serves to scan the reflected beam of light 40 through a sector whose angular extent is defined by the number of facets formed on the end of the rotating shaft 30. The remainder of the optical system rotates simultaneously with the mirror 38 so that the second point of focus 44 and the third point of focus 52 simultaneously scan through a pair of identical arcs. All of these lenses utilized in the apparatus are used monochromatically and image only information on or closely adjacent to the optical axis. Therefore, the lenses may be made to perform essentially in the diffraction limited regime. This type of performance is imaging requires very simple and inexpensive optical elements to accomplish.

The printer 10 also includes a second fixture 68 which is radially translatable relative to the rotational axis 28 of the first fixture 20. This radial translation is indicated generally by the arrow 70. The second fixture 68 includes means, such as an indentation 72 in the top surface thereof for positioning a partially transparent master mask 74 so as to intersect the optical axis 16 at or adjacent to the second point of focus 44. The variance from the point of focus determines the size of the spot illuminated on the master mask 74. A similar defocussing must take place at the integrated circuit substrate.

The mask 74 is a conventional mask such as has been used in the prior art for exposing a photoresist layer on a semiconductor wafer. An aperture 76 is formed in the fixture 68 so as to allow the scanning beam of light which is incident on and partially transmitted through the mask 74 to pass to the optical system below. The aperture 76 must be at least as large as the portion of the mask which it is desired to image onto a semiconductor substrate.

The second fixture 68 also includes means for positioning an integrated circuit substrate 78 generally orthogonal to the axis 16 and at or adjacent to the third point of focus 52. The means may be a mechanical alignment means such as the depression 72 for the mask or may be an electrooptic system as will be described more fully hereinbelow.

In order that the semiconductor substrate 78 may be completely exposed by the beam of light to all of the information stored in the master mask 74, it is necessary that a means be provided for translating the second fixture relative to the first fixture at a predetermined rate which is directly proportional to the rotational speed of the first fixture 20. Preferably, the relative translation is radial. This translation is accomplished in the embodiment shown in FIG. 1 of the drawing by applying a signal on line 84 to a base control 82 for the second fixture 68. The origin of the signal on the line 84 is a signal processing electronics circuit 96 which will be more fully explained hereinbelow. The base control 82 includes a servo motor (not shown) and causes the second fixture 68 to move toward the first fixture 20 in the predetermined manner. Any typical mechanical means may be associated with the motor for accomplishing such translational motion at the predetermined rate and is included within the purview of the invention. Also, direct mechanical interconnection of the first and second fixtures through a linkage or gear train may be utilized.

In this manner, the second fixture 68 is translated toward the rotating first fixture 30 such that the beam of light at the second point of focus 44 is scanned sequentially across the entire surface of the master mask 74 and an image thereof is sequentially composed on the integrated circuit substrate 78 by the simultaneous scan of the third point of focus 52. The rate of advance of the second fixture 68 relative to the first fixture 20 is determined by the spot size at the points of focus 44 and 52 such that each successive scan is tangent to the preceding scan and displaced therefrom by approximately the diameter of the illuminated spot.

Although the foregoing description has described the parts necessary for accomplishing the complete scanning of the master mask 74 and the formation of an image on the semiconductor wafer 78, it is intended and is included within the purview of the invention that the apparatus 10 include a plurality of parallel systems arranged around a common rotational axis 28. In such a system, the light from a single laser source 12 may be switched from the facet 38 to the next adjacent facet on the end of the shaft 30. Simultaneously, an additional complete optical system from the facet onward is rotated into position by including a plurality of such optical systems in the disc-like sections 54, 64, and 66. The distance between the vertical section of the reflected beam optical axis 16 and the rotational axis 28 is identical for each of the plurality of parallel optical systems. By including such a plurality of parallel optical systems, the rate at which the second fixture 68 is translated relative to the first fixture 20 is increased. Therefore, the scanning process may be greatly foreshortened by the inclusion of the plurality of such systems.

As a specific example of this arrangement, for a mask and substrate approximately 2 inches square and a spot size, $s$, of 5 micrometers, the number of optical systems which may be included in the apparatus is $$N = C/m$$

where $C$ is the circumference of the scanned circle and $m$ is the mask scan length.

$$N = \frac{2\pi (2.5'')}{2} \cong 7$$

The time, $t$, necessary to complete one raster is $$t = \frac{m}{sNV}$$

where $V$ is the rotational speed of the first fixture 20. An inch equals approximately 25,000 micrometers.

$$t = \frac{2(25,000)}{5(7)(14,300)} \cong 0.1 \text{ min}$$

Kodak Ortho Resist (KOR) requires an energy of 80 mw-sec/cm² for full exposure at 4880 A. The area of a 5 micrometer spot is about 20 ($10^{-8}$) cm². Therefore, the total power required exclusive of optical losses in the system is about 270 mw.

In addition, it is included within the purview of the invention that a plurality, not necessarily identical to the plurality of optical systems, of secondary fixtures 68 be included at various radial positions around the first rotating fixture 20. When such plural secondary fixtures are included, a plurality of different semiconductor wafer substrates 78 may be exposed simultaneously. When a plurality of secondary fixtures 68 are utilized in a single apparatus, a like plurality of light sources 12 and associated optics for delivering the beam of light to the facet mirror 38 are necessary in the embodiment of FIG. 1.

An additional feature of the present invention which may be included is a feedback scheme for adjusting the relative positions of the master mask 74 and semiconductor wafer 78 so that precise alignment therebetween may be accomplished during successive operations. A beam splitter 86 is emplaced transverse to the optical axis 16 so as to reflect a portion of any light reflected from either the wafer or mask into a secondary reflected beam path 88. A collecting lens 90 serves to focus this reflected light onto a photodetector 92 which generates an electrical signal indicative of the intensity of the light incident thereon. The electrical signal thus generated is supplied on a line 94 to a signal processing electronics circuit 96 which analyzes the time-varying intensity of the return signal such as by comparing it to a predetermined standard signal and thereby derives information about the relative positions of the mask and wafer.

The signal processing electronics circuit 96 generates an error signal on line 98 which is applied to a substrate alignment servo circuit 100 which is used to control servo positioners attached to the semiconductor wafer 78 and activated by signals on line 102. The semiconductor wafer is thereby adjusted in position so that proper focus and alignment are automatically attained.

Figure 2:
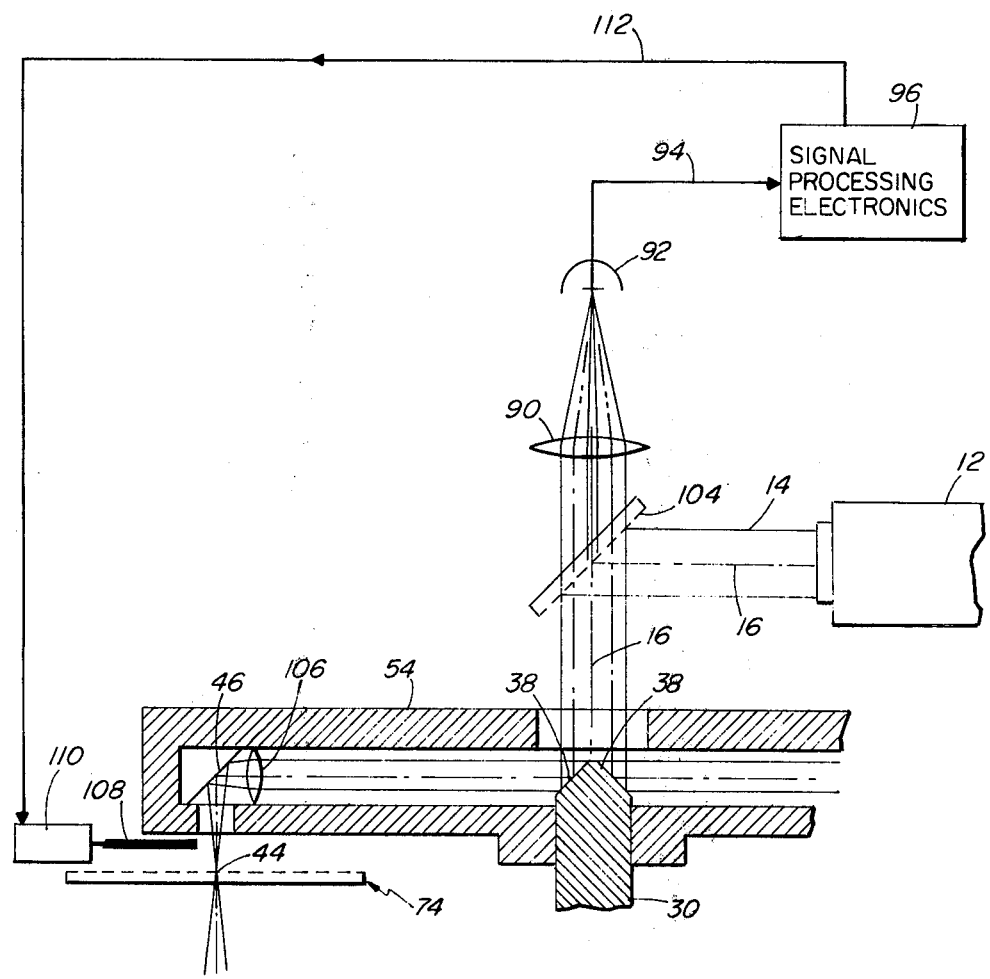
FIG. 2 is a partial view of a modification to the apparatus of FIG. 1 for use with a plurality of integrated circuit substrates.

FIG. 2 of the drawing shows an alternative arrangement which is particularly useful when a plurality of secondary fixtures 68 is included in the apparatus 10. The source of light 12 emits a collimated beam of light along an optical axis 16 as in the embodiment of FIG. 1. However, a partially reflective mirror 104 is emplaced transverse to the collimated beam 14 to deflect the beam of light to be coaxial with the rotational axis of the shaft 30. In this manner, if the width of the beam 14 at the end of the shaft 30 is sufficiently large each of the mirror facets 38 which are ground onto the end of the shaft 30 are illuminated equally with a collimated beam of light. A separate smaller collimated beam of light is deflected radially outward in the first fixture to a first lens 106 (only one of which is shown). The lens 106 serves to focus the previously collimated beam of light at a first point of focus 44 which is at or closely adjacent to the master mask 74. The succeeding elements of each parallel optical system are identical to those shown in FIG. 1.

In this manner, a plurality of optical systems may be emplaced at regular intervals around the circumference of the apparatus 10 and a plurality of different semiconductor substrates may be exposed simultaneously. This further increases the operational speed of the exposure process.

In a manner similar to that shown in the embodiment of FIG. 1, the partially reflecting mirror 104 is slightly transparent so that light reflected from the master mask 74 or the semiconductor substrate 78 can pass therethrough after which it is collected by a lens 90 and focussed onto a photodetecting device 92. The electrical signal from the photodetecting device 92 is applied on line 94 to the signal processing electronics circuit 96 as in the embodiment shown in FIG. 1. However, in this embodiment, a modification must be made in order to accomplish the alignment function. Since the photodetector device 92 is normally looking at light reflected by each of the plurality of masks and substrates located around the periphery of the device simultaneously, it is necessary that the reflected light incident on the photodetector 92 be limited to that light which is reflected from a particular mask and substrate combination. Therefore, a shutter 108 which is controlled by an activator 110, such as a solenoid, is provided at each station around the periphery of the apparatus. When alignment of the substrate and mask combinations is required, all but one of the stations is occluded by the application of signals to the respective activators 110 such as by a line 112 from the signal processing electronics circuit 96. In this manner, only a single station is examined at a time.

The modification set forth in FIG. 2 of the drawing as described above makes it possible to utilize a single light source and photodetector combination for a plurality of circumferentially disposed operational stations. This significantly reduces the cost of the apparatus. It also employs fully illuminated mirror facets 38 on the end of the rotating shaft 30 rather than the small area illumination described with respect to the embodiment of FIG. 1. This feature makes the light intensity incident on the mask 74 and the substrate 52 less susceptible to minor imperfections n the mirrored surface 38 than was the case when a nominally focussed beam of light is passed across that surface.

While there have been shown and described what are considered to be preferred embodiments of the present invention, it will be obvious to those skilled in the art that various changes and modifications may be made therein without departing from the spirit of the invention as defined in the appended claims.

I claim:

1. A scanning photographic printer for integrated circuits comprising:
   a source of a beam of light generally transmitted and centered along an optical axis;
   a first fixture which is rotatable about an axis of rotation and which includes
      a first mirror which is adjacent and inclined to the axis of rotation of the first fixture and affixed thereto, the first mirror being inclined also to the optical axis so that at least a portion of light is reflected away from the axis of rotation and is scanned through a sector as the mirror rotates,
      optical means disposed in the reflected beam of light and affixed to the first fixture for bringing the reflected beam of light to a first point of focus along a reflected beam optical axis defined by the optical means,
      a second mirror affixed to the first fixture for reflecting the beam of light so that the reflected beam optical axis is generally parallel to the axis of rotation, the second mirror reflecting the beam of light prior to the first point of focus, and
      a unitary power, nonreversing optical system aligned along the reflected beam optical axis beyond the first point of focus for bringing the reflected beam of light to a second point of focus;
   a second fixture which is radially translatable relative to the rotating first fixture and which includes
      means for positioning a partially transparent mask generally orthogonal to the reflected beam optical axis in the vicinity of first point of focus, and
      means for positioning an integrated circuit substrate to be photographically printed generally orthogonal to the reflected beam optical axis in the vicinity of the second point of focus; and
   means for translating the second fixture relative to the first fixture at a predetermined rate which is directly proportional to the velocity at which the reflected beam of light is scanned across the surface of the substrate, whereby the image of the mask is sequentially imposed on the integrated circuit substrate thereby photographically exposing the integrated circuit substrate.

2. A scanning photographic printer for integrated circuits according to claim 1, wherein there is further included means for rotating the first fixture at a predetermined rotational speed.

3. A scanning photographic printer for integrated circuits according to claim 2, wherein the beam of light from the source is essentially monochromatic.

4. A scanning photographic printer for integrated circuits according to claim 3, wherein the source is a laser.

5. A scanning photographic printer for integrated circuits comprising:
   a source of a beam of light generally transmitted and centered along an optical axis;
   a first fixture which is rotatable about an axis of rotation and which includes
      a central shaft about which the first fixture rotates, a facet being formed on an end of the shaft to define a first mirror which is adjacent and inclined to the axis of rotation of the first fixture and affixed thereto, the first mirror being inclined also to the optical axis so that at least a portion of light is reflected away from the axis of rotation and is scanned through a sector as the mirror rotates;
      optical means disposed in the reflected beam of light and affixed to the first fixture for bringing the reflected bean of light to a first point of focus along a reflected beam optical axis defined by the optical means,
      a second mirror affixed to the first fixture for reflecting the beam of light so that the reflected beam optical axis is generally parallel to the axis of rotation, the second mirror reflecting the beam of light prior to the first point of focus, and
      a unitary power, nonreversing optical system aligned along the reflected beam optical axis beyond the first point of focus for bringing the reflected beam of light to a second point of focus;
   a second fixture which is radially translatable relative to the rotating first fixture and which includes
      means for positioning a partially transparent mask generally orthogonal to the reflected beam optical axis in the vicinity of the first point of focus, and
      means for positioning an integrated circuit substrate to be photographically printed generally orthogonal to the reflected beam optical axis in the vicinity of the second point of focus; and means for translating the second fixture relative to the first fixture at a predetermined rate which is directly proportional to the rotational speed of the first fixture whereby the reflected beam of light is scanned sequentially across the surface of the mask and an image thereof is sequentially imposed on the integrated circuit substrate, thereby photographically exposing the integrated circuit substrate.

6. A scanning photographic printer for integrated circuits according to claim 5, wherein the optical axis immediately prior to the first mirror is separate from and approximately parallel to the axis of rotation and wherein the first mirror is inclined at approximately at 45° angle to the optical axis and the axis of rotation.

7. A scanning photographic printer for integrated circuits according to claim 5, wherein there are further included a beam splitter disposed transversely to the optical axis prior to reflection by the first mirror, the beam splitter deflecting a portion of any light reflected back along the optical axis by the mask and integrated circuit substrate off the optical axis, a photodetector positioned to receive the reflected light deflected off the optical axis by the beam splitter and generating an electrical signal indicative of the intensity of the received light, and means responsive to the electrical signal for adjusting the relative lateral positions of the mask and integrated circuit substrate so that precise alignment of the image being imposed on the integrated circuit substrate with preexisting patterns may be maintained.

8. A scanning photographic printer for integrated circuits according to claim 7, wherein there are further included means attached to the first fixture electrically connected to the means responsive to the electrical signal for occluding the reflected beam of light prior to the first point of focus.

9. A scanning photographic printer for integrated circuits according to claim 5, wherein there are a plurality of facets formed on the end of the shaft and a like plurality of associated succeeding optical systems in the first fixture.

10. A scanning photographic printer for integrated circuits according to claim 9, wherein there are a plurality of a second fixtures positioned around the first fixture.

11. A scanning photographic printer for integrated circuits according to claim 10, wherein the optical axis prior to the first mirror is coaxial with the central shaft and wherein the beam of light illuminates all of the first mirrors equally.

* * * * *